United States Patent [19]

Yoshida

[11] Patent Number: 5,287,305
[45] Date of Patent: Feb. 15, 1994

[54] MEMORY DEVICE INCLUDING TWO-VALUED/N-VALUED CONVERSION UNIT

[75] Inventor: Yukihiro Yoshida, Ikoma, Japan

[73] Assignee: Sharp Kabushiki Kaisha, Osaka, Japan

[21] Appl. No.: 904,577

[22] Filed: Jun. 26, 1992

[30] Foreign Application Priority Data

Jun. 28, 1991 [JP] Japan .................................. 3-158698

[51] Int. Cl.$^5$ .............................................. G11C 13/00
[52] U.S. Cl. .................................. 365/189.01; 365/168
[58] Field of Search ............. 365/189.01, 168, 189.03, 365/189.04, 189.05

[56] References Cited

U.S. PATENT DOCUMENTS 4,024,512  5/1977  Amelio et al. .................. 365/238

Primary Examiner—Terrell W. Fears

[57] ABSTRACT

A memory device comprises a memory cell array including a plurality of memory cells for storing n-valued data, an unit for converting a binary logic data applied thereto into an n-valued logic data when the binary logic data is written into the memory cell array, and an unit for converting an n-valued logic data into a binary logic data when the n-valued logic data is read out from the memory cell array.

35 Claims, 9 Drawing Sheets

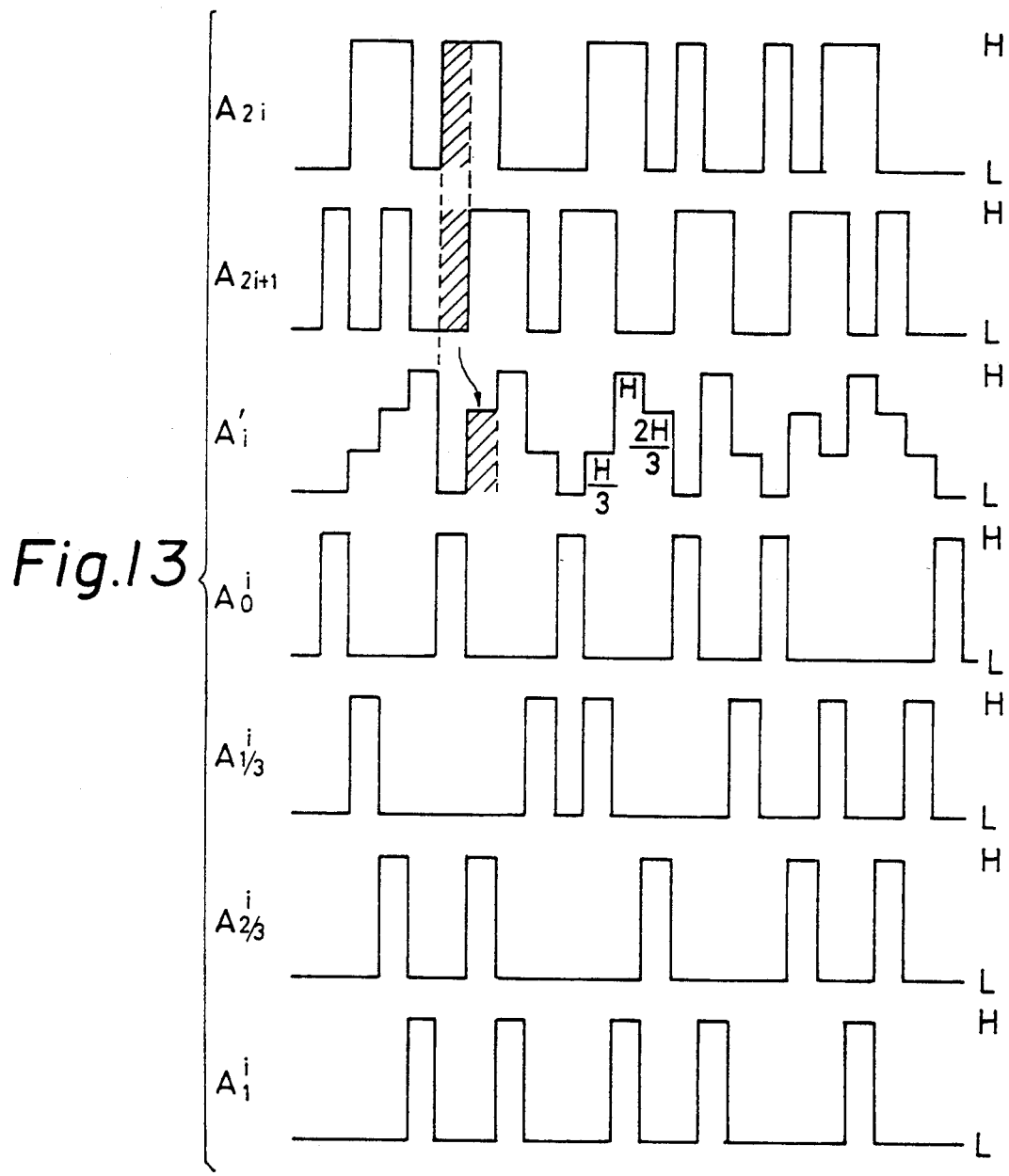

MEMORY DEVICE INCLUDING TWO-VALUED/N-VALUED CONVERSION UNIT

BACKGROUND OF THE INVENTION

1. Field of the Invention

The present invention relates to a memory device and, more particularly, to a semiconductor memory device including memory cells for storing n-valued information.

2. Description of the Related Art

With the progressive advancement in semiconductor technology, the capacity of the semiconductor memory devices is becoming increasingly large. However, the capacity increase has been achieved so far chiefly relying on miniaturizing technology of the memory cells for storing binary information. Therefore, it has also become apparent that the conventional method for capacity increase has its limitations. Meanwhile, on the user side, it is becoming necessary more and more to process a large volume of data or the like at high speed, and therefore, there is no end to requirement for semiconductor memory devices with larger capacity.

Conventionally, the memory capacity is sometimes increased substantially by data compression, that is, compressed data is stored in a smaller area of a semiconductor memory device. More specifically, in the case of text data, data is compressed by Huffman method, and in the case of image data in facsimile, for example, data is compressed by the MH (Modified Huffman) method. Data thus compressed is stored.

On the other hand, the Huffman method compresses data by assigning codes having short bit length to characters which occur with high frequency. Also in the MH method, short codes are assigned to patterns which occur with high frequency. Therefore, those methods are used for compression and restoration of data in units of data blocks with specified block length, so that those methods can only be used for image data accessed sequentially or text data for batch processing. Thus, those methods had no practical use for data that is accessed randomly in byte units, for example, on the semiconductor memory device.

SUMMARY OF THE INVENTION

It is therefore an object according to the present invention to provide a memory device capable of handling compressed data that can be accessed randomly or sequentially by using memory cells that store n-valued information and thereby increasing the quantity of data stored in each memory cell.

The above object can be achieved by a memory device according to the present invention, which comprises a memory cell array having a plurality of memory cells for storing n-valued data (n is an integer of 3 or larger), an unit for converting a binary logic data to an n-valued logic data when the binary logic data is written into the memory cell array, and an unit for converting an n-valued logic data into a binary logic data when the n-valued logic data is read out from the memory cell array.

In the memory device according to the present invention structured as described above, the unit for converting a binary logic data to an n-valued logic data converts the binary logic data to n-valued logic data, and then the n-valued logic data is written in specified memory cells of the memory cell array. Therefore, data stored in a certain number of conventional memory cells for storing binary information can be stored in a smaller number of memory cells for storing n-valued information. When an n-valued logic data written in the memory cells is read out, the n-valued logic data is converted into the corresponding binary logic data and output from the memory.

Therefore, as with the conventional memory device using binary logic, a binary logic data can be written or read to and from the memory device by external devices. Overhead is minimal by conversion between binary logic and n-valued logic.

The memory device according to the present invention is capable of storing the same amount of data in a smaller number of memory cells than in the conventional data memory device, and if the number of memory cells is the same as in the conventional memory device, these can store a much larger amount of data in compressed form. In addition, data can be converted in units of a smaller number of bits, so that data can be accessed randomly without causing large overhead.

In a preferred embodiment, a memory device is provided with a memory cell array including a plurality of memory cells for storing n-valued (n is an integer of 3 or larger) data, an unit for converting a binary logic data applied thereto into an n-valued logic data when the binary logic data is written into the memory cell array, an unit for converting an n-valued logic data into a binary logic data when the n-valued logic data is read out from the memory cell array, and an unit for decoding an n-valued logic address applied thereto and for outputting a signal decoded from the n-valued logic address to the memory cell array.

In the memory cell device, the number of circuits elements forming the decoding unit can be reduced since n-valued logic is used.

Further objects and advantages of the present invention will be apparent from the following description of the preferred embodiments of the invention as illustrated in the accompanying drawings.

BRIEF DESCRIPTION OF THE DRAWINGS

FIG. 13 is a timing-chart flow diagram of input binary address signals, a converted address signal and signals through equivalent circuits.

DESCRIPTION OF THE PREFERRED EMBODIMENTS

Description will now be made of preferred embodiments of the present invention.

Figure 1:
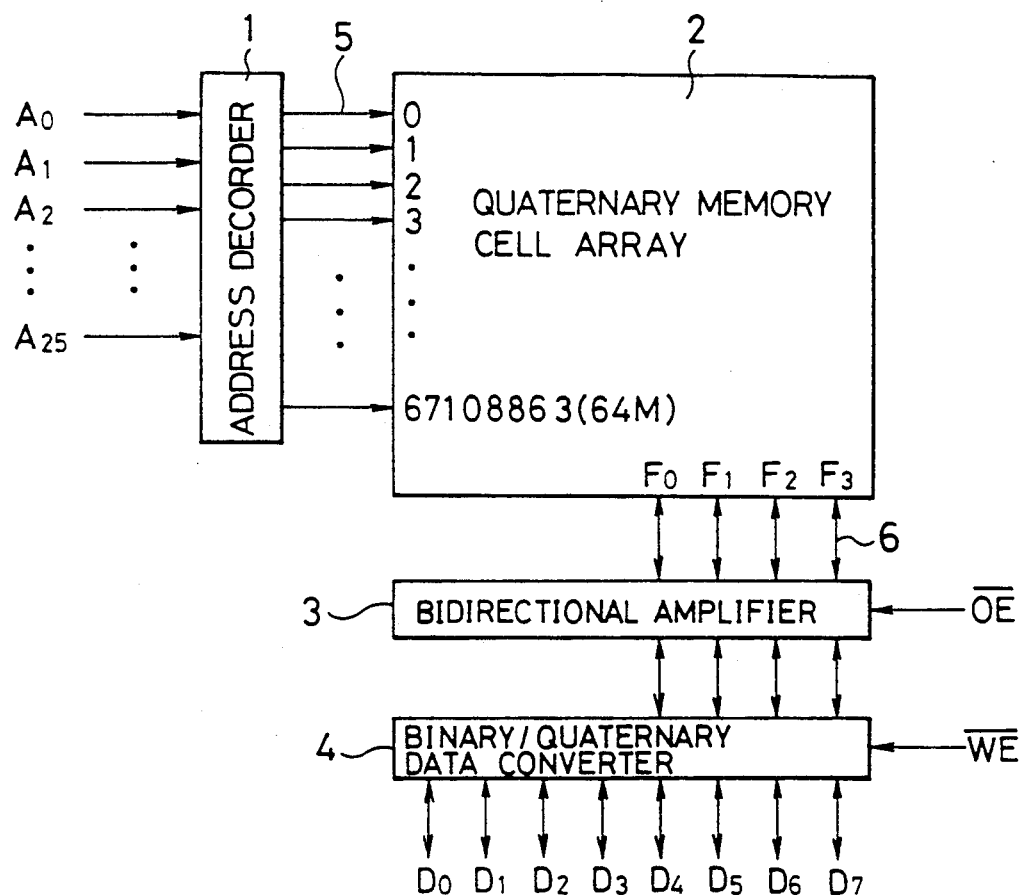
FIG. 1 is a block diagram showing the structure of the semiconductor memory device according to a first embodiment of the present invention.

FIG. 1 shows a first embodiment of the present invention. This embodiment is a case in which this invention is applied to a flash memory (a flash type EEPROM (Electrically Erasable and Programmable Read Only Memory)). The flash memory can be provided with a large capacity larger than a DRAM, and being non-volatile, does not require a battery backup. Therefore, this is a semiconductor memory device showing promises for growing demand in the future in electronic equipment in which power consumption is required to be reduced.

The flash memory comprises an address decoder 1, a quaternary memory cell array 2, a bidirectional amplifier 3, and a binary/quaternary bidirectional data converter 4.

The address decoder 1 is a decoder circuit for selecting any of 64-M (26th power of 2) address lines 5 by a 26-bit address as a group of binary digits $A_0$ to $A_{25}$. The quaternary memory cell array 2 is a memory element containing a plurality of memory cells, each of which is selected by one of the 64-M address lines, and a logic data as a group of quaternary digits $F_0$ to $F_3$ are written and read to and from the memory cells selected through the four data lines 6. A quaternary logic data of $F_0$ to $F_3$ which is written and read through the data lines 6 is amplified by the bidirectional amplifier 3 controlled by an output enable signal $\overline{OE}$. A quaternary logic data of $F_0$ to $F_3$ amplified by the bidirectional amplifier 3 is converted by the binary/quaternary bidirectional data converter 4 into a binary logic data of $D_0$ to $D_7$, and vice versa. The binary/quaternary bidirectional data converter 4 is controlled by a write enable signal $\overline{WE}$. The flash memory according to this embodiment can be accessed from outside by a binary logic data of $D_0$ to $D_7$, and functions as an ordinary byte-address memory.

Figure 2:
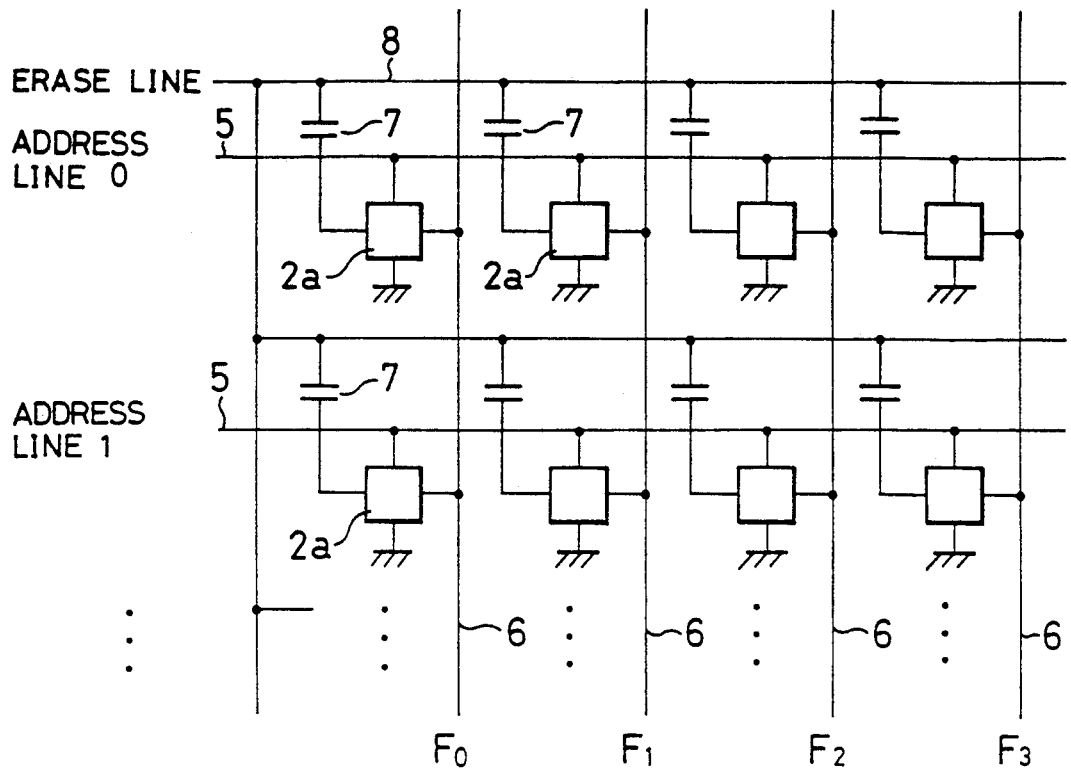
FIG. 2 is a block diagram showing the internal structure of the memory cell array in the first embodiment.

The above-mentioned quaternary memory cell array 2 is composed of a number of memory cells 2a as shown in FIG. 2. The memory cells 2a are connected in groups of four memory cells 2a to one of the address lines 5. Each memory cell 2a of a group is connected to a common data line 6 shared with the corresponding memory cells 2a of other groups. Therefore, when an address line 5 is selected by an address of $A_0$ to $A_{25}$ as described with reference to FIG. 1, only a group of memory cells 2a connected to this selected address line can be accessed through the data lines 6.

Each memory cell 2a is formed by a MOS transistor utilizing the tunnel effect. Also, each memory cell 2a can store four states, called state 0, state $\frac{1}{3}$, state $\frac{2}{3}$, and state 1. The four states is discriminated by three kinds of threshold voltages. A logic data as a group of quaternary digits $F_0$ to $F_3$ are input and output on the four data lines 6 connected to each memory cell 2a.

It ought to be noted that for simplicity's sake, in this embodiment, each memory cell 2a is arranged so as to be selected by one address line 5, but the memory cells may be connected in a matrix form, and arranged so that each memory cell is accessed by specifying a row address and a column address.

Each memory cell 2a is connected through a capacitor 7, including an insulating film, to an erase line 8, so that stored data can be erased collectively. Besides this collective erasure, it is possible to realize erasure in block units (one block may be 512 bytes, 1024 bytes, 2048 bytes, 4096 bytes, for example) by changing the arrangement of the erase lines.

If a variable in N-valued logic is denoted by $X_k$, this $X_k$ takes N kinds of value and satisfies the following relation.

$$x_k = \bigvee_{M=0}^{N-1} \frac{M}{N-1} \left( x_k = \frac{M}{N-1} \right),$$

$$x_k = \bigvee_{M=0}^{N-1} \left( 1 - \frac{M}{N-1} \right) \left( x_k = \frac{M}{N-1} \right)$$

$$\bigvee_{M=0}^{N-1} \left( x_k = \frac{M}{N-1} \right) = 1$$

WHEN $I \neq J$, $\left( x_k = \frac{I}{N-1} \right)\left( x_k = \frac{J}{N-1} \right) = 0$

WHEN $I = J$, $$\left( x_k = \frac{I}{N-1} \right)\left( x_k = \frac{J}{N-1} \right) = \left( x_k = \frac{I}{N-1} \right)$$

$$\left( x_k = \frac{I}{N-1} \right) + \left( x_k = \frac{J}{N-1} \right) = \left( x_k = \frac{I}{N-1} \right)$$

where the symbol V denotes the logical OR, and (A≡B) denotes an operator which makes the value in parentheses 1 when A equals B and 0 when A differs from B, also N designates an n-valued number.

In quaternary logic, $X_k$ takes four values (0, $\frac{1}{3}$, $\frac{2}{3}$, 1) which satisfy the following equation.

$$X_k = \tfrac{1}{3}(X_k \equiv \tfrac{1}{3}) + \tfrac{2}{3}(X_k \equiv \tfrac{2}{3}) + (X_k \equiv 1)$$

$$\overline{X_k} = (X_k \equiv 0) + \tfrac{2}{3}(X_k \equiv \tfrac{1}{3}) + \tfrac{1}{3}(X_k \equiv \tfrac{2}{3})$$

Each value of one digit in quaternary logic corresponds to one corresponding value in two bits in binary logic on a one-to-one correspondence as shown in the Table 1.

TABLE 1

| BINARY DATA | | QUATERNARY DATA |
|---|---|---|
| $D_{2i+1}$ | $D_{2i}$ | $F_i$ |
| 0 | 0 | 0 |
| 0 | 1 | $\tfrac{1}{3}$ |
| 1 | 0 | $\tfrac{2}{3}$ |
| 1 | 1 | 1 |

A logic data of four quaternary digits $F_0$ to $F_3$ which are input and output on the four data lines 6 can be converted from a logic data of eight binary digits $D_0$ to $D_7$ by the numerical expression shown below.

$(i=0) F_0 = \tfrac{1}{3}\overline{D_1}D_0 + \tfrac{2}{3}D_1\overline{D_0} + D_1D_0$ $(i=1) F_1 = \frac{1}{3}\overline{D_3}D_2 + \frac{2}{3}D_3\overline{D_2} + D_3D_2$ $(i=2) F_2 = \frac{1}{3}\overline{D_5}D_4 + \frac{2}{3}D_5\overline{D_4} + D_5D_4$ $(i=3) F_3 = \frac{1}{3}\overline{D_7}D_6 + \frac{2}{3}D_7\overline{D_6} + D_7D_6$ On the other hand, a logic data as a group of eight binary digits $D_0$ to $D_7$ can be converted from a logic data as a group of four quaternary digits $F_0$ to $F_3$ by the numerical following expression.

$(i=0) \begin{cases} D_0 = \left(F_0 = \frac{1}{3}\right) + (F_0 = 1) \\ D_1 = \left(F_0 = \frac{2}{3}\right) + (F_0 = 1) \end{cases}$ $(i=1) \begin{cases} D_2 = \left(F_1 = \frac{1}{3}\right) + (F_1 = 1) \\ D_3 = \left(F_1 = \frac{2}{3}\right) + (F_1 = 1) \end{cases}$ $(i=2) \begin{cases} D_4 = \left(F_2 = \frac{1}{3}\right) + (F_2 = 1) \\ D_5 = \left(F_2 = \frac{2}{3}\right) + (F_2 = 1) \end{cases}$ $(i=3) \begin{cases} D_6 = \left(F_3 = \frac{1}{3}\right) + (F_3 = 1) \\ D_7 = \left(F_3 = \frac{2}{3}\right) + (F_3 = 1) \end{cases}$ If data stored in n pieces of conventional memory cells is equal to the same amount of data stored in m pieces of memory cells according to the first embodiment, the relation shown as the following expression holds.

$$4^m = 2^n$$

Another way of writing the above equation is $$m = \frac{n}{2}$$

The memory device according to the first embodiment can store the same amount of data in a memory cell array composed of memory cells, which are one-half of the number of conventional memory cells. If memory cells for storing octal logic are used, the number of memory cells required is one third of the conventional number. If memory cells for hexadecimal logic are used, the number of memory cells required is one fourth of the conventional number. Even in the case of ternary logic which will be mentioned later, a little redundancy occurs, but about two third of memory cells suffice as shown by the following expression.

$$m = \frac{\log 2}{\log 3} n$$

In quaternary logic, a quaternary logic data in four digits correspond to a data of one byte (8 bits) in binary logic on a one-to-one correspondence. Therefore, a data corresponding to eight binary logic memory cells can be stored by four memory cells $2a$. In other words, a quaternary memory cell array 2 with a 64 MB memory capacity can be formed by the same number of memory cells as the number of memory cells used in the conventional binary logic memory cell array with a 32 MB memory capacity.

Figure 3:
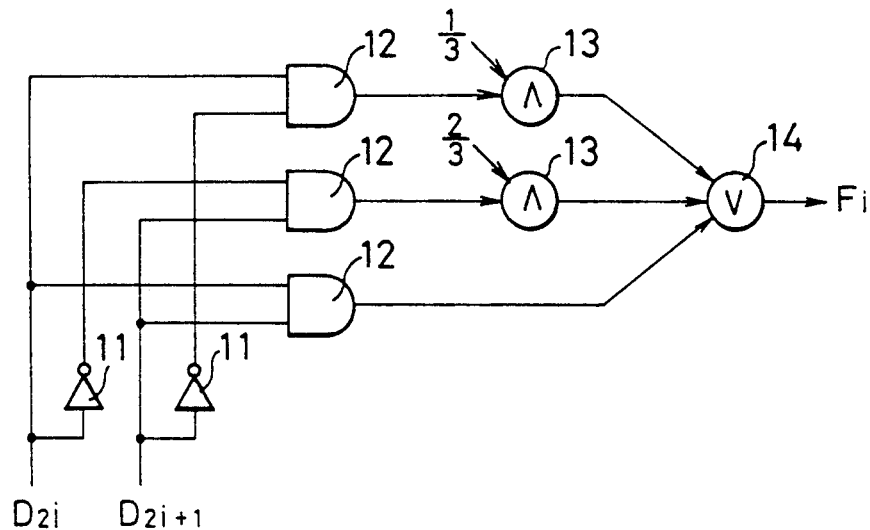
FIG. 3 is a logic circuit diagram of a binary-quaternary data converter in the first embodiment.
Figure 4:
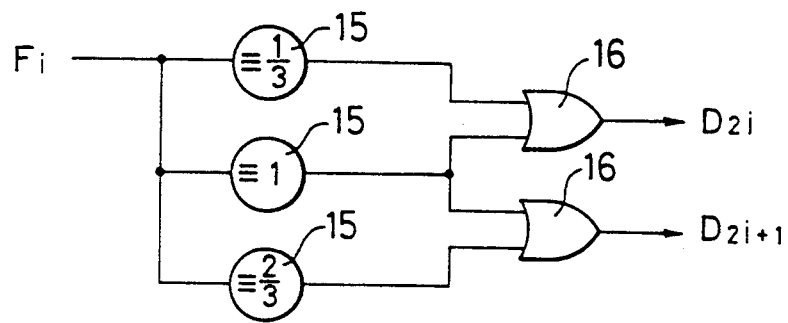
FIG. 4 is a quaternary-binary data converter according to the first embodiment.

The binary/quaternary bidirectional data converter 4 is a circuit for performing conversions based on the numerical expressions shown above. The binary/quaternary bidirectional data converter 4 comprises a binary-quaternary data converter shown in FIG. 3 and a quaternary-binary data converter shown in FIG. 4. When data is written in the quaternary memory cell array, a binary logic data of $D_0$ to $D_7$ is converted to a quaternary logic data of $F_0$ to $F_3$ by the binary-quaternary data converter of FIG. 3. When data is read from the quaternary memory cell array, a quaternary logic data of $F_0$ to $F_3$ is converted to a binary logic data of $D_0$ to $D_7$ by the quaternary-binary data converter of FIG. 4. The binary-quaternary data converter of FIG. 3 decodes a binary logic data in two bits by two inverters 11 and three AND circuits 12, and data thus obtained are encoded into a quaternary logic data in one bit by two quaternary logic AND circuits 13 and a quaternary logic OR circuit 14. The quaternary-binary data converter of FIG. 4 decodes a quaternary logic data of one digit by three kinds of equivalent circuit 15, and decoded data is encoded into a binary data in two digits by two binary logic OR circuits 16. Generally, conversion is possible between binary logic data and any given n-valued logic data by using a combination of a binary logic data decoder or encoder and an n-valued logic data encoder or decoder. Though FIGS. 3 and 4 show only conversion circuits for one quaternary logic signal, or any one of $F_0$ to $F_3$, but a conversion circuit may be formed for other digits.

The relation between a binary logic data of $D_0$ to $D_7$ and a quaternary logic data of $F_0$ to $F_3$ is not limited to the one as shown in Table 1, but may be as shown in Table 2.

TABLE 2

| BINARY DATA | | QUATERNARY DATA |
|---|---|---|
| D2i + 1 | D2i | Fi |
| 0 | 0 | 0 |
| 0 | 1 | $\frac{1}{3}$ |
| 1 | 1 | $\frac{2}{3}$ |
| 1 | 0 | 1 |

In this case, conversion from a binary logic data of $D_0$ to $D_7$ to a quaternary logic data of $F_0$ to $F_3$ can be done by the numerical expression shown below.

Figure 5:
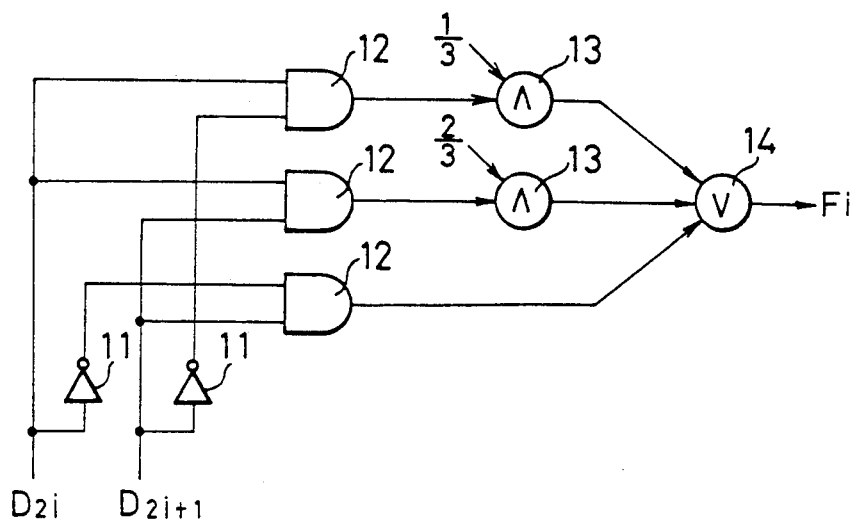
FIG. 5 is a logic circuit diagram of another binary-quaternary data converter.

$(i=0) F_0 = \frac{1}{3}\overline{D_1}D_0 + \frac{2}{3}D_1D_0 + D_1\overline{D_0}$ $(i=1) F_1 = \frac{1}{3}\overline{D_3}D_2 + \frac{2}{3}D_3D_2 + D_3\overline{D_2}$ $(i=2) F_2 = \frac{1}{3}\overline{D_5}D_4 + \frac{2}{3}D_5D_4 + D_5\overline{D_4}$ $(i=3) F_3 = \frac{1}{3}\overline{D_7}D_6 + \frac{2}{3}D_7D_6 + D_7\overline{D_6}$ For the above-mentioned conversion, a binary-quaternary data converter shown in FIG. 5 is used. This binary-quaternary data converter is of the same structure as shown in FIG. 3, but the decoder comprising two inverters 11 and three AND circuits 12 is partially modified to satisfy the numerical expression shown above. Conversion from a quaternary logic data of $F_0$ to $F_3$ to a binary logic data of $D_0$ to $D_7$ is done by a numerical expression shown below.

$$(i=0)\begin{cases} D_0 = \left(F_0 = \frac{1}{3}\right) + \left(F_0 = \frac{2}{3}\right) \\ D_1 = \left(F_0 = \frac{2}{3}\right) + (F_0 = 1) \end{cases}$$

$$(i=1)\begin{cases} D_2 = \left(F_1 = \frac{1}{3}\right) + \left(F_1 = \frac{2}{3}\right) \\ D_3 = \left(F_1 = \frac{2}{3}\right) + (F_1 = 1) \end{cases}$$

$$(i=2)\begin{cases} D_4 = \left(F_2 = \frac{1}{3}\right) + \left(F_2 = \frac{2}{3}\right) \\ D_5 = \left(F_2 = \frac{2}{3}\right) + (F_2 = 1) \end{cases}$$

$$(i=3)\begin{cases} D_6 = \left(F_3 = \frac{1}{3}\right) + \left(F_3 = \frac{2}{3}\right) \\ D_7 = \left(F_3 = \frac{2}{3}\right) + (F_3 = 1) \end{cases}$$

Figure 6:
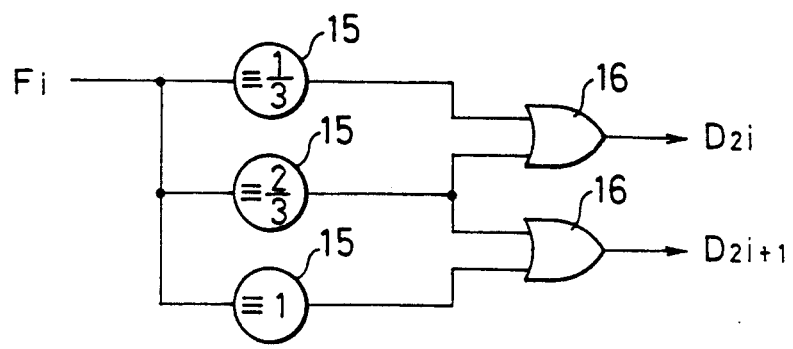
FIG. 6 is a logic circuit diagram of another quaternary-binary data converter.

For the above purpose, a quaternary-binary data converter shown in FIG. 6 is used. Also, this quaternary-binary data converter is of the same structure as shown in FIG. 4, but the decoder comprising three kinds of equivalent circuits 15 is partially modified to satisfy the numerical expression shown above.

Figure 7:
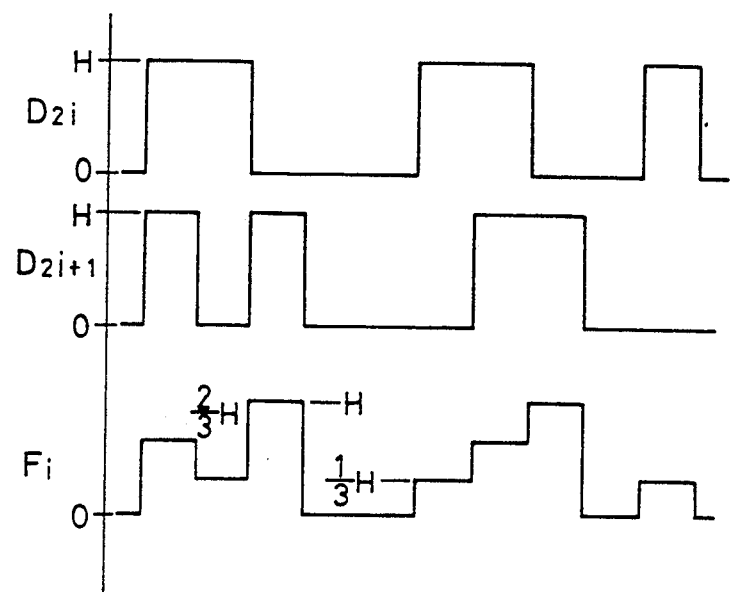
FIG. 7 is a time chart showing the operation of the binary-quaternary data converter in FIG. 5.

FIG. 7 shows a data conversion operation when the binary-quaternary data converter shown in FIG. 5 is used. When a binary logic data of two bits "11" is input, a quaternary logic data of $\frac{2}{3}$ state is output. When a binary logic data input is "01", quaternary logic data of $\frac{1}{3}$ state is output. When binary logic data input is "10", quaternary logic data of 1 state is output. When binary logic data input is "00", quaternary logic data of 0 state output.

Figure 8:
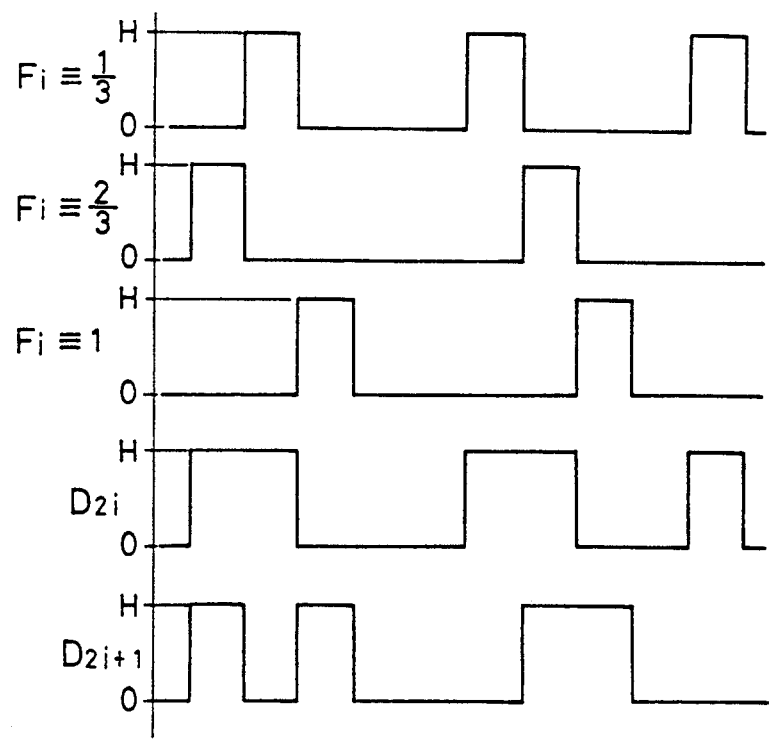
FIG. 8 is a time chart showing the operation of the quaternary-binary data converter in FIG. 6.

FIG. 8 shows a data conversion operation when the quaternary-binary data converter shown in FIG. 6 is used. When one-digit quaternary logic data of $\frac{2}{3}$ state is input, only the result of an equivalent operation with "$\frac{2}{3}$" (or (A=$\frac{2}{3}$)) is 1, and two-bit binary logic data of "11" is output. When a quaternary logic data input is $\frac{1}{3}$ state, binary logic data of "01" is output. When a quaternary logic data input is 1 state, binary logic data of "10" is output. When a quaternary logic data input is 0, binary logic data of "00" is output.

As has been described, according to this embodiment, since memory cells 2a for storing quaternary logic data are used, data of 64 MB can be stored in a flash memory containing the conventional number of memory cells for storing 32 MB data. Moreover, data is converted from a binary logic data of $D_0$ to $D_7$ into a quaternary logic data of $F_0$ to $F_3$ when input into the memory cells 2a and is converted from a quaternary logic data of $F_0$ to $F_3$ when output from the memory cells 2a by the binary/quaternary data converter 4. Therefore, data can be handled in the same manner as in the conventional flash memory outside the binary/quaternary data converter 4.

In the description of the above-mentioned embodiment, a case in which memory cells 2a for storing quaternary logic data are used has been shown. However, in applications in which n-valued logic data, that is, ternary or higher-valued logic data is stored, it is possible to store the same amount of data in a smaller number of memory cells than in the conventional binary logic memory devices.

In the case of ternary logic data, it is possible to have two-digit ternary logic data correspond to three-bit binary logic data in the relation as shown in Table 3.

TABLE 3

| BINARY DATA | | | TERNARY DATA | |
|---|---|---|---|---|
| D0 | D1 | D2 | T0 | T1 |
| 0 | 0 | 0 | 0 | 0 |
| 0 | 1 | 0 | 0 | $\frac{1}{2}$ |
| 0 | 1 | 1 | 0 | 1 |
| 0 | 0 | 1 | $\frac{1}{2}$ | 0 |
| 1 | 0 | 1 | $\frac{1}{2}$ | $\frac{1}{2}$ |
| 1 | 1 | 1 | $\frac{1}{2}$ | 1 |
| 1 | 1 | 0 | 1 | 0 |
| 1 | 0 | 0 | 1 | $\frac{1}{2}$ |
| | | | 1 | 1 |

And, the three-bit binary logic data is converted into two-digit ternary logic data by the following numerical expression.

$$T_0 = \tfrac{1}{2}(\overline{D_1}D_2 + D_0D_2) + D_0\overline{D_2}$$

$$T_1 = \tfrac{1}{2}(D_0\overline{D_1} + \overline{D_0}D_1\overline{D_2}) + D_1D_2$$

Figure 9:
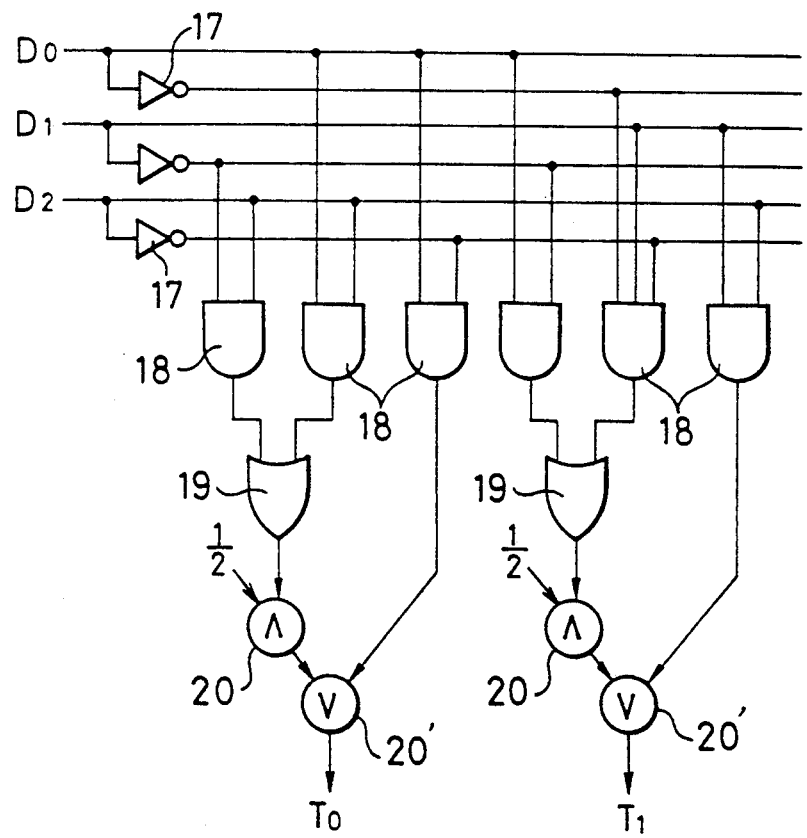
FIG. 9 is a logic circuit diagram of the binary-ternary data converter in a second embodiment of the present invention.
Figure 10:
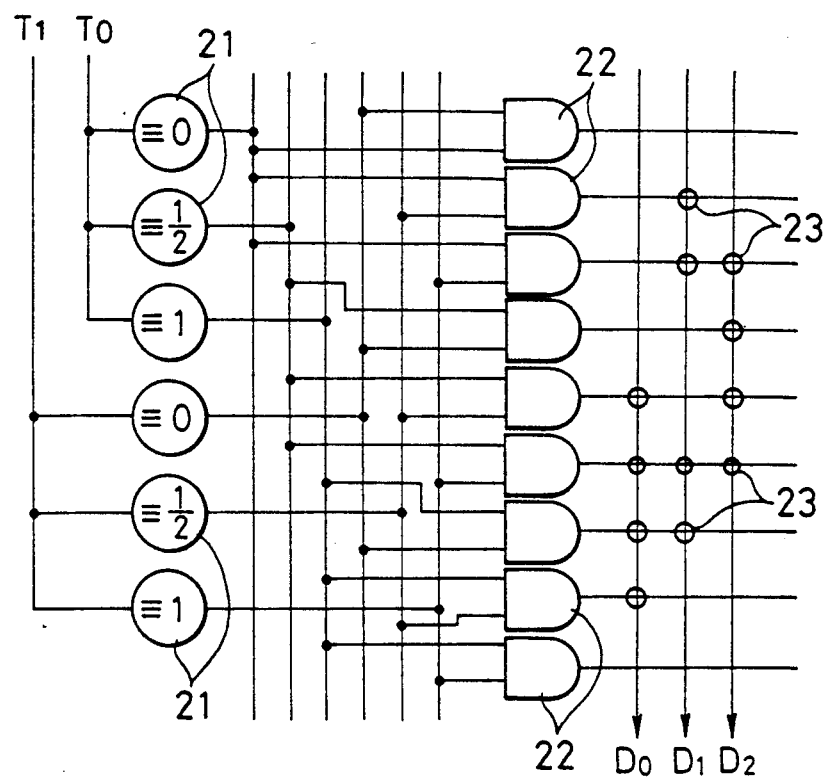
FIG. 10 is a logic circuit diagram of the ternary-binary data converter in the second embodiment.

For the above conversion, a binary-ternary data converter shown in FIG. 9 is used. This binary-ternary data converter comprises three inverters 17, six AND circuits 18, two OR circuits 19, two ternary logic AND circuits 20, and two ternary logic OR circuits 20'. A ternary-binary data converter, as shown in FIG. 10, comprises three kinds of ternary logic equivalent circuit 21, nine AND circuits 22, and three OR circuits connected to outputs $D_0$, $D_1$, and $D_2$. Each OR circuit is constituted by connecting points 23 for connecting an output of the AND circuit 22 with a binary output. In the case of ternary logic, as is apparent from Table 3, no binary data exists which corresponds to two-digit ternary data "11", and some wastefulness occurs in this redundant portion.

In the above embodiment, only a case is shown in which this invention is applied to the flash memory. However, this invention can be applied to semiconductor memory devices, such as a DRAM, SRAM, mask RAM, etc.

As is obvious from the above description, according to the present invention, by having data stored in compressed form in the memory cells for storing n-valued logic, the memory capacity of a data memory device can be increased without increasing the number of memory cells used.

In the embodiments described, a binary data is converted into a quaternary data and vice versa in binary/quaternary data converter and there is provided with the address decoder for a binary address, but a quaternary address may be applied to the quaternary memory cell.

Figure 11:
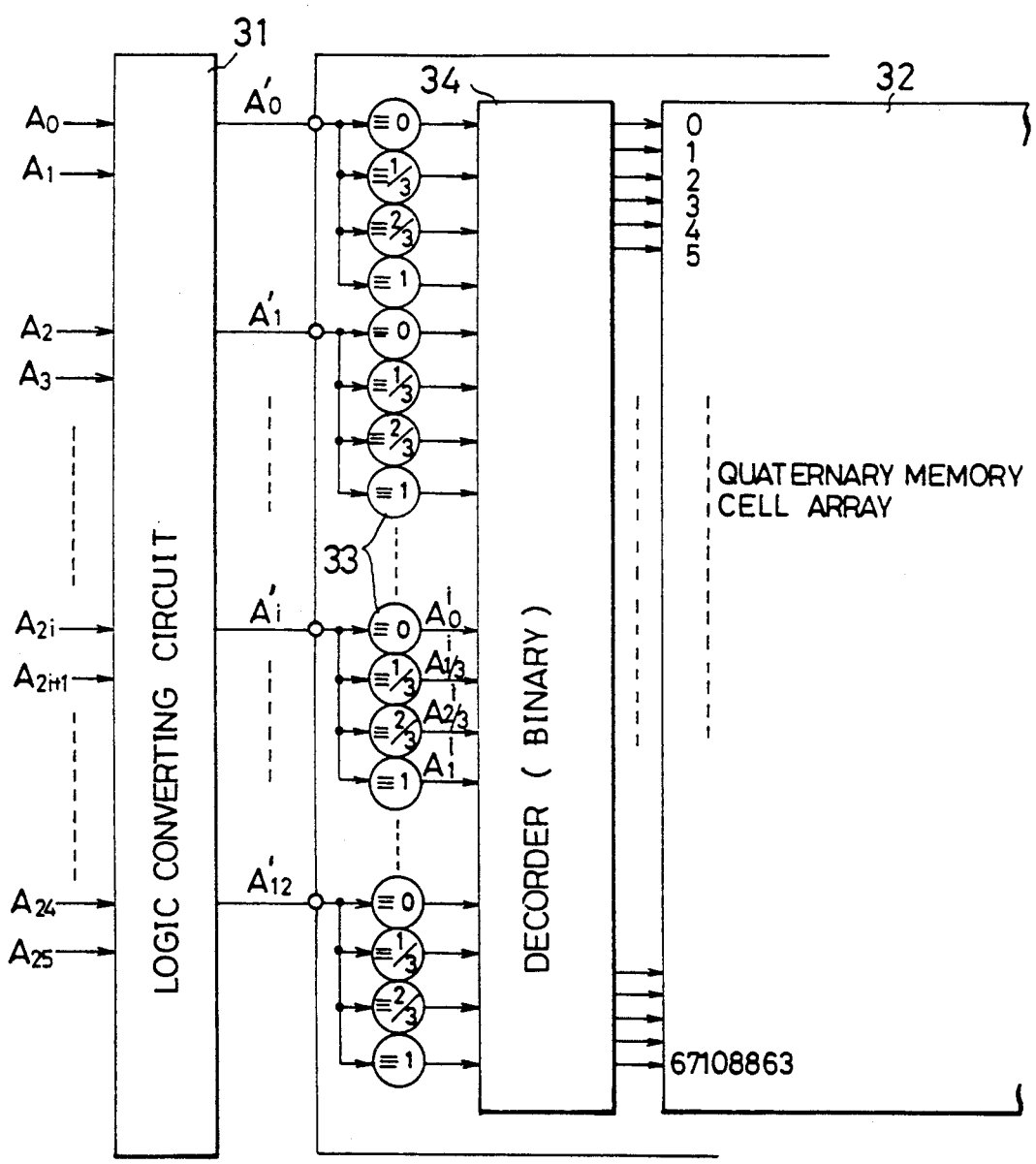
FIG. 11 is a block diagram showing the structure of the semiconductor memory device according to another embodiment of the present invention.

FIG. 11 shows an embodiment including a logic converting circuit 31 and a decoder 34 for a quaternary address. A binary address of $A_0$ to $A_{25}$ is converted into a quaternary address in the logic converting 31. Each value of one digit in quaternary logic corresponds to one corresponding value in two bits in binary logic on an one-to-one correspondence as shown in Table 4 in the same manner as the binary/quaternary data convertor of the first embodiment. When a 26-bit address as a group of binary digits $A_0$ to $A_{25}$ are given via an address bus, the logic converting circuit 31 obtains a 13-bit address as a group of quaternary digits $A'_0$ to $A'_{12}$, in accordance with the following equation.

$$A'_i = \tfrac{1}{3}\overline{A_{2i}}A_{2i+1} + \tfrac{2}{3}A_{2i}\overline{A_{2i+1}} + A_{2i}A_{2i+1}$$

TABLE 4

| BINARY ADDRESS | | QUATERNARY ADDRESS |
|---|---|---|
| $A_{2i}$ | $A_{2i+1}$ | $A_i$ |
| 0 | 0 | 0 |
| 0 | 1 | $\tfrac{1}{3}$ |
| 1 | 0 | $\tfrac{2}{3}$ |
| 1 | 1 | 1 |

The converting circuit 31 outputs the converted address to the decoder 34 through equivalent circuits 33.

The decoder 34 decodes the converted address signals by equivalent circuits 33 and outputs the decoded signals to the quaternary memory cell array 32.

The conventional address decoder requires about $(n \times 2^n)$ of circuit elements in the case that it includes n inputs. In the other hand, the decoder 34 according to the embodiment requires about $((n/2) \times 2^n)$ of circuits elements, which are one-half of the number of conventional circuit elements. For example, the address decoder 1 of the first embodiment in FIG. 1 is constituted by 1,744,830,464 of circuits element, but the address decoder 34 in FIG. 11 can be constituted by 872,415,232 of circuit elements.

Figure 12:
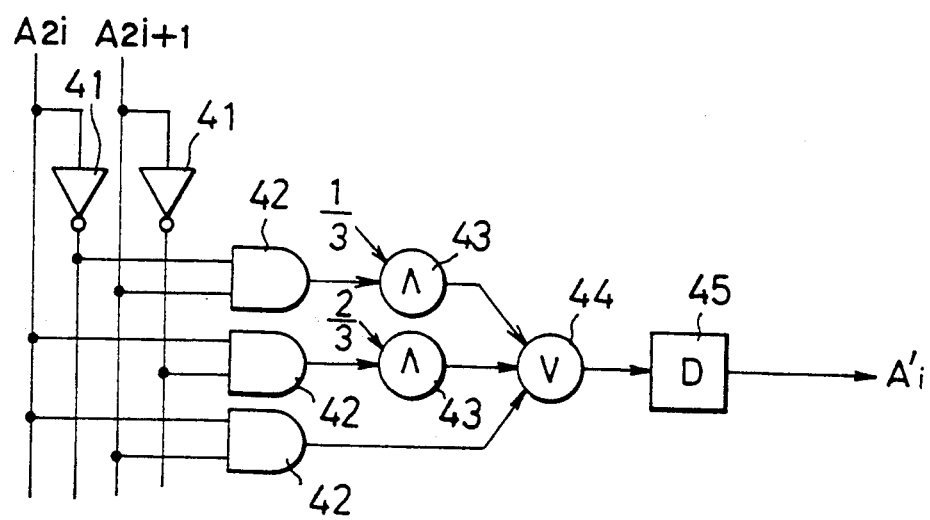
FIG. 12 is a logic circuit diagram of a logic converting circuit in the embodiment as shown in FIG. 11.

The logic converting circuit 31 may be constituted by a plurality of converters shown in FIG. 12. The binary-quaternary address converter of FIG. 12 decodes a binary logic address in two bits by two inverters 41 and three AND circuits 42, and address signals thus obtained are encoded into a quaternary logic address in one bit by two quaternary logic AND circuits 43 and a quaternary logic OR circuit 44. The quaternary logic address is input into a D flip-flop 45 to produce a time delay of the address and to shape the address signal. FIG. 13 shows a timing-chart flow diagram of input binary address signals, a converted address signal and signals through equivalent circuits. The binary address signals $A_{2i}$ and $A_{2i+1}$ are converted and delayed into the quaternary address signal $A'_i$. Then the signal $A'_i$ are input into four equivalent circuits 33 and converted into $A^i{}_0$, $A^i{}_{\tfrac{1}{3}}$, $A^i{}_{\tfrac{2}{3}}$, and $A^i{}_1$ respectively at the respective equivalent circuit shown in FIG. 13.

The memory device may be provided with no logic converting circuit 31 for converting a binary address into a quaternary address as shown in FIG. 11. A quaternary logic address may be supplied from a CPU via a quaternary address bus. In this case, the quaternary address signals are directly input to equivalent circuits involved in the quaternary memory cell array. Therefore, the reduction of the number of circuits elements can reduce the dimensions of the address decoder as well as the memory device.

In the above-mentioned embodiment, a binary address is converted into a quaternary address in the logic converting circuit, but a binary address may be converted into a ternary address.

Many widely embodiments of the present invention may be constructed without departing from the spirit and the scope of the present invention is not limited to the specific embodiments described in the specification, except as defined in the appended claims.

What is claimed is:

1. A memory device comprising:
    a memory cell array including a plurality of memory cells each for storing an n-valued (n is an integer of 3 or larger) digital data;
    means for converting a binary digital data applied thereto into an n-valued digital data using a plurality of logic operating circuits when the binary digital data is written into said memory cell array; and
    means for converting an n-valued digital data into a binary digital data using a plurality of logic operating circuits when the n-valued digital data is read out from said memory cell array.

2. A memory device according to claim 1, wherein said means for converting a binary digital data into an n-valued digital data include at least a decoder and an encoder.

3. A memory device according to claim 2, wherein for one digital 4-valued or quaternary signal applied to one memory cell, said decoder comprises two inverters each receiving an input binary logic signal and three first AND logic circuits each receiving one of said input binary logic signals, two of said first AND circuits being connected to outputs of said inverters respectively, and wherein said encoder comprises two second AND logic circuits each receiving an quaternary constant datum except the highest state datum and the lowest state datum and connected to one of said first AND circuits, and an OR circuit connected to outputs of said second AND circuits and one first AND circuit, an quaternary logic signal being output by said OR circuit.

4. A memory device according to claim 2, wherein for two digital 3-valued or ternary signals applied to two memory cells, said decoder comprises three inverters each receiving an input binary logic signal and six first AND logic circuits each receiving at least one of said input binary logic signals, some of said first AND circuits being connected to outputs of said inverters respectively, and said encoder comprises two first OR circuits each connected to two of said first AND circuits, two second AND logic circuits each receiving a middle state constant data and connected to said first OR circuits, and second OR circuits connected respectively to outputs of said second AND circuits and two first AND circuits, two ternary logic signals being output respectively by said second OR circuits.

5. A memory device according to claim 3, wherein said means for converting an n-valued digital data into a binary digital data include at least a decoder and an encoder.

6. A memory device according to claim 5, wherein said decoder comprises a plurality of equivalent circuits each determining whether an n-valued digital data read out of said memory cell array is equivalent to a constant n-valued digital data or not thereby to output a state 1 signal to said encoder if the n-valued data equals the constant data.

7. A memory device according to claim 6, wherein for one quaternary digital signal read out of one memory cell, said decoder comprises three equivalent circuits connected in parallel to an input receiving a quaternary digital data, and said encoder comprises two OR circuits each connected to two of said equivalent circuits, two binary digital data being output by said OR circuits.

8. A memory device according to claim 6, wherein for two ternary digital signals read out of two memory cells, said decoder comprises two sets of three equivalent circuits connected in parallel to an input receiving one of said two ternary digital data, and said encoder comprises nine AND circuits each connected to two of said equivalent circuits, three binary digital data being output by said AND circuits.

9. A memory device according to claim 1, wherein said means for converting a binary digital data into an n-valued digital data and said means for converting an n-valued digital data into a binary digital data are composed of a bidirectional n-valued/binary data conversion circuit and a bidirectional amplifier coupled between said memory cell array and said bidirectional n-valued/binary data conversion circuit.

10. A memory device according to claim 9, wherein said bidirectional n-valued/binary data conversion circuit is a bidirectional binary/quaternary conversion circuit for converting a binary digital data into a quaternary digital data and vice versa.

11. A memory device according to claim 9, wherein said bidirectional n-valued/binary data conversion circuit is a bidirectional binary/ternary conversion circuit for converting a binary digital data into a ternary digital data and vice versa.

12. A memory device comprising:
a memory cell array including a plurality of memory cells each for storing a digital n-valued (n is integer of 3 or larger) datum;
means for converting a binary digital data applied thereto into an n-valued digital data using a plurality of logic operating circuits when the binary digital data is written into said memory cell array;
means for converting an n-valued digital data into a binary digital data using a plurality of logic operating circuits when the n-valued digital data is read out from said memory cell array; and
means for decoding an n-valued logic address applied thereto and for outputting a signal decoded from the n-valued logic address to said memory cell array.

13. A memory device according to claim 12, wherein said means for converting a binary digital data into an n-valued digital data include at least a decoder and an encoder.

14. A memory device according to claim 13, wherein for one digital 4-valued or quaternary signal applied to one memory cell, said decoder comprises two inverters each receiving an input binary logic signal and three first AND logic circuits each receiving one of said input binary logic signals, two of said first AND circuits being connected to outputs of said inverters respectively, and wherein said encoder comprises two second AND logic circuits each receiving an quaternary constant data except the highest state datum and the lowest state datum and connected to one of said first AND circuits, and an OR circuit connected to outputs of said second AND circuits and one first AND circuit, an quaternary logic signal being output by said OR circuit.

15. A memory device according to claim 13, wherein for two digital 3-valued or ternary signals applied to two memory cells, and said decoder comprises three inverters each receiving an input binary logic signal and six first AND logic circuits each receiving at least one of said input binary logic signals, some of said first AND circuits being connected to outputs of said inverters respectively, and said encoder comprises two first OR circuits each connected to two of said first AND circuits, two second AND logic circuits each receiving a middle state constant data and connected to said first OR circuits, and second OR circuits connected respectively to outputs of said second AND circuits and two first AND circuits, two ternary logic signals being output respectively by said second OR circuits.

16. A memory device according to claim 12, wherein said means for converting an n-valued digital data into a binary digital data include at least a decoder and an encoder.

17. A memory device according to claim 16, wherein said decoder comprises a plurality of equivalent circuits each determining whether an n-valued digital data read out of said memory cell array is equivalent to a constant n-valued digital data or not thereby to output a state 1 signal to said encoder if the n-valued data equals the constant data.

18. A memory device according to claim 16, wherein for one quaternary digital signal read out of one memory cell, said decoder comprises three equivalent circuits connected in parallel to an input receiving a quaternary digital data, and said encoder comprises two OR circuits each connected to two of said equivalent circuits, two binary digital data being output by said OR circuits.

19. A memory device according to claim 16, wherein for two ternary digital signals read out of two memory cells, said decoder comprises two sets of three equivalent circuits connected in parallel to an input receiving one of said two ternary digital data, and said encoder comprises nine AND circuits each connected to two of said equivalent circuits, three binary digital data being output by said AND circuits.

20. A memory device according to claim 12, wherein said means for converting a binary digital data into an n-valued digital data and said means for converting an n-valued digital data into a binary digital data are composed of a bidirectional n-valued/binary data conversion circuit and a bidirectional amplifier coupled between said memory cell array and said bidirectional n-valued/binary data conversion circuit, and said decoding means includes m address inputs, m groups of n equivalent circuits each connected to the respective address input, and a binary decoder connected to said all equivalent circuits and said memory cell array.

21. A memory device according to claim 20, wherein said bidirectional n/valued/binary data conversion circuit is a bidirectional binary/quaternary conversion circuit for converting a binary digital data into a quaternary digital data and vice versa.

22. A memory device according to claim 20, wherein said bidirectional n-valued/binary data conversion circuit is a bidirectional binary/ternary conversion circuit for converting a binary digital data into a ternary digital data and vice versa.

23. A memory device according to claim 20, wherein said decoding means further includes a logic converting circuit connected to said address inputs for converting a binary address from the outside into an n-valued address and supplying the n-valued address to said address inputs.

24. A memory device comprising:
a memory cell array including a plurality of memory cells each for storing a digital n-valued (n is an integer of 3 or larger) data;
means for converting a binary digital data applied thereto into an n-valued digital data using a plurality of logic operating circuits when the binary digital data is written into said memory cell array; and
means for converting an n-valued digital data into a binary digital data using a plurality of logic operating circuits when the n-valued digital data is read out from said memory cell array,
said means for converting a binary digital data into an n-valued digital data and said means for converting an n-valued digital data into a binary digital data being composed of a bidirectional n-valued/binary data conversion circuit and a bidirectional amplifier coupled between said memory cell array and said bidirectional n-valued/binary data conversion circuits.

25. A memory device according to claim 24, wherein said means for converting a binary digital data into an n-valued digital data include at least a decoder and an encoder.

26. A memory device according to claim 24, wherein for one digital 4-valued or quaternary signal applied to one memory cell, said decoder comprises two inverters each receiving an input binary logic signal and three first AND logic circuits each receiving one of said input binary logic signals, two of said first AND circuits being connected to outputs of said inverters respectively, and wherein said encoder comprises two second AND logic circuits each receiving an quaternary constant datum except the highest state datum and the lowest state datum and connected to one of said first AND circuits, and an OR circuit connected to outputs of said second AND circuits and one first AND circuit, an quaternary logic signal being output by said OR circuit.

27. A memory device according to claim 25, wherein for two digital 3-valued or ternary signals applied to two memory cells, said decoder comprises three inverters each receiving an input binary logic signal and six first AND logic circuits each receiving at least one of said input binary logic signals, some of said first AND circuits being connected to outputs of said inverters respectively, and said encoder comprises two first OR circuits each connected to two of said first AND circuits, two second AND logic circuits each receiving a middle state constant data and connected to said first OR circuits, and second OR circuits connected respectively to outputs of said second AND circuits and two first AND circuits, two ternary logic signals being output respectively by said second OR circuits.

28. A memory device according to claim 24, wherein said means for converting an n-valued digital data into a binary digital data include at least a decoder and an encoder.

29. A memory device according to claim 28, wherein said decoder comprises a plurality of equivalent circuits each determining whether an n-valued digital data read out of said memory cell array is equivalent to a constant n-valued digital data or not thereby to output a state 1 signal to said encoder if the n-valued data equals the constant data.

30. A memory device according to claim 29, wherein for one quaternary digital signal read out of one memory cell, said decoder comprises three equivalent circuits connected in parallel to an input receiving a quaternary digital data, and said encoder comprises two OR circuits each connected to two of said equivalent circuits, two binary digital data being output by said OR circuits.

31. A memory device according to claim 29, wherein for two ternary digital signals read out of two memory cells, said decoder comprises two sets of three equivalent circuits connected in parallel to an input receiving one of said two ternary digital data, and said encoder comprises nine AND circuits each connected to two of said equivalent circuits, three binary digital data being output by said AND circuits.

32. A memory device according to claim 24, wherein said bidirectional n-valued/binary data conversion circuit is a bidirectional binary/quaternary conversion circuit for converting a binary digital data into a quaternary digital data and vice versa.

33. A memory device according to claim 24, wherein said bidirectional n-valued/binary data conversion circuit is a bidirectional binary/ternary conversion circuit for converting a binary digital data into a ternary digital data and vice versa.

34. A memory device according to claim 24, wherein said device further comprises means for decoding an n-valued logic address applied thereto and for outputting a signal decoded from the n-valued logic address to aid memory cell array.

35. A memory device according to claim 34, wherein said decoding means include m address inputs, m groups of n equivalent circuits each connected to the respective address input, and a binary decoder connected to said all equivalent circuits and said memory cell array.

* * * * *